(12) United States Patent
Risk et al.

(10) Patent No.: US 7,555,085 B1
(45) Date of Patent: Jun. 30, 2009

(54) CDR ALGORITHMS FOR IMPROVED HIGH SPEED IO PERFORMANCE

(75) Inventors: Gabriel C. Risk, Burlingame, CA (US); Naveen G. Malur, Santa Clara, CA (US); Jason H. Bau, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 696 days.

(21) Appl. No.: 11/209,947

(22) Filed: Aug. 23, 2005

(51) Int. Cl.
*H04L 7/00* (2006.01)
(52) U.S. Cl. ......... 375/354; 375/373; 375/375; 375/376; 327/156; 327/160
(58) Field of Classification Search ......... 375/371–376; 327/153–163
See application file for complete search history.

(56) References Cited

U.S. PATENT DOCUMENTS

| | | | |
|---|---|---|---|
| 5,402,448 A * | 3/1995 | Marko et al. | 375/340 |
| 6,194,969 B1 | 2/2001 | Doblar | |
| 6,219,395 B1 * | 4/2001 | Pollack et al. | 375/371 |
| 6,516,422 B1 | 2/2003 | Doblar et al. | |
| 6,614,862 B1 | 9/2003 | Doblar | |
| 6,731,667 B1 * | 5/2004 | Lee et al. | 375/130 |
| 6,937,680 B2 | 8/2005 | Fong et al. | |
| 2004/0012577 A1 | 1/2004 | Naegle | |
| 2007/0019773 A1 * | 1/2007 | Zhou | 375/373 |

OTHER PUBLICATIONS

"Designing Bang-Bang PLLs for Clock and Data Recovery in Serial Data Transmission Systems"; Richard C. Walker, Agilent Laboratories, Palo Alto, CA; pp. 1-2.
"A Second-Order Semi-Digital Clock Recovery Circuit Based on Injection Locking"; M.-J. Edward Lee, William J. Dally, John Poulton, Trey Greer, John Edmondson, Ramin Farjad-Rad, Hiok-Tiaq Ng, Rohit Rathi, and Ramesh Senthinathan; Vilio Communications, Milpitas, CA & Stanford University, Stanford, CA; ISSCC 2003/Session 4/Clock Recovery and Backplane Transceivers/ Paper 4.3; © 2003 IEEE International Solid-State Circuits Conference.
"Designing Bang-Bang PLLs for Clock and Data Recovery in Serial Data Transmission Systems"; Richard C. Walker, Agilent Laboratories, Palo Alto, CA; pp. 1-12, IEEE Press, Feb. 2003.

* cited by examiner

*Primary Examiner*—Curtis B Odom
(74) *Attorney, Agent, or Firm*—Rory D. Rankin; Meyertons Hood Kivlin Kowert & Goetzel, P.C.

(57) ABSTRACT

A data receiver system. The system includes a clock generator configured to output a reference clock and circuitry configured to measure a direction of a phase difference between an input data stream and the reference clock. The circuitry is further configured to increment a counter if the phase difference is in a first direction, decrement the counter if the phase difference is in a direction opposite to the first direction, and convey a phase correction signal to the clock generator if an output value of the counter meets or exceeds a threshold. The clock generator is configured to adjust the phase of the reference clock in response to receiving the phase correction signal.

18 Claims, 6 Drawing Sheets

CDR ALGORITHMS FOR IMPROVED HIGH SPEED IO PERFORMANCE

BACKGROUND OF THE INVENTION

1. Field of the Invention

This invention relates to the recovery of source-synchronous digital data in a receiver and, more particularly, to algorithms for recovering a clock signal corresponding to the digital data signal in the presence of environmentally induced changes in clock frequency and phase.

2. Description of the Related Art

Source-synchronous communication links in which a clock is recovered from a data stream are increasingly common elements of high-speed data interfaces. A number of well-known techniques may be used to recover a clock signal from a data signal including a variety of phase-locked loop and delay-locked loop designs. Once a clock has been recovered, it may be used to resample the incoming data. Preferably, the phase of the recovered clock is adjusted so that the received data signal is sampled near the mid-point between bit transitions so as to maximize timing margin and minimize the bit-error-rate (BER). Uncorrected jitter in the phase of the recovered clock tends to move the sampling point away from the ideal point in the received data signal, resulting in poor timing margins and/or a higher BER. Consequently, the speed at which a communications link can operate is related to the accuracy of both the frequency and phase of the recovered clock.

In order to adjust the phase of the recovered clock, transition points in the received data signal may be compared to transitions in the recovered clock. Various well-known sampling circuits may be employed to compare the timing of transitions of the received data with the transitions of the recovered clock. These sampling circuits typically produce a phase error signal indicating whether a given bit transition is early or late as compared to the recovered clock. Information contained in the phase error signal may then be used to adjust the phase of the recovered clock so that the phase error is minimized. However, phase error signals are sensitive to jitter sources such as environmental fluctuations that affect the phase and frequency of data and clock signals. Consequently, it is desirable to detect and correct these fluctuations. Unfortunately, phase error signals may also be sensitive to jitter induced by random bit patterns in the incoming data. Therefore, it may also be desirable to minimize the sensitivity of phase corrections to these bit patterns. Accordingly, phase error signals are typically filtered prior to being used to adjust the phase of the recovered clock.

In view of the above, effective systems and methods of filtering phase error signals to reduce their sensitivity to random bit patterns while accurately tracking phase errors caused by environmental changes are desired.

SUMMARY OF THE INVENTION

Various embodiments of a data receiver are disclosed. In one embodiment, the data receiver comprises a clock generator configured to output a reference clock and circuitry configured to convey a phase correction signal to the clock generator. The circuitry is configured to measure a direction of a phase difference between an input data stream and the reference clock. The circuitry is further configured to increment a counter if the phase difference is in a first direction, decrement the counter if the phase difference is in a direction opposite to the first direction, and convey a phase correction signal to the clock generator if an output value of the counter meets or exceeds a threshold. The clock generator is configured to adjust the phase of the reference clock in response to receiving the phase correction signal.

Figure 1:
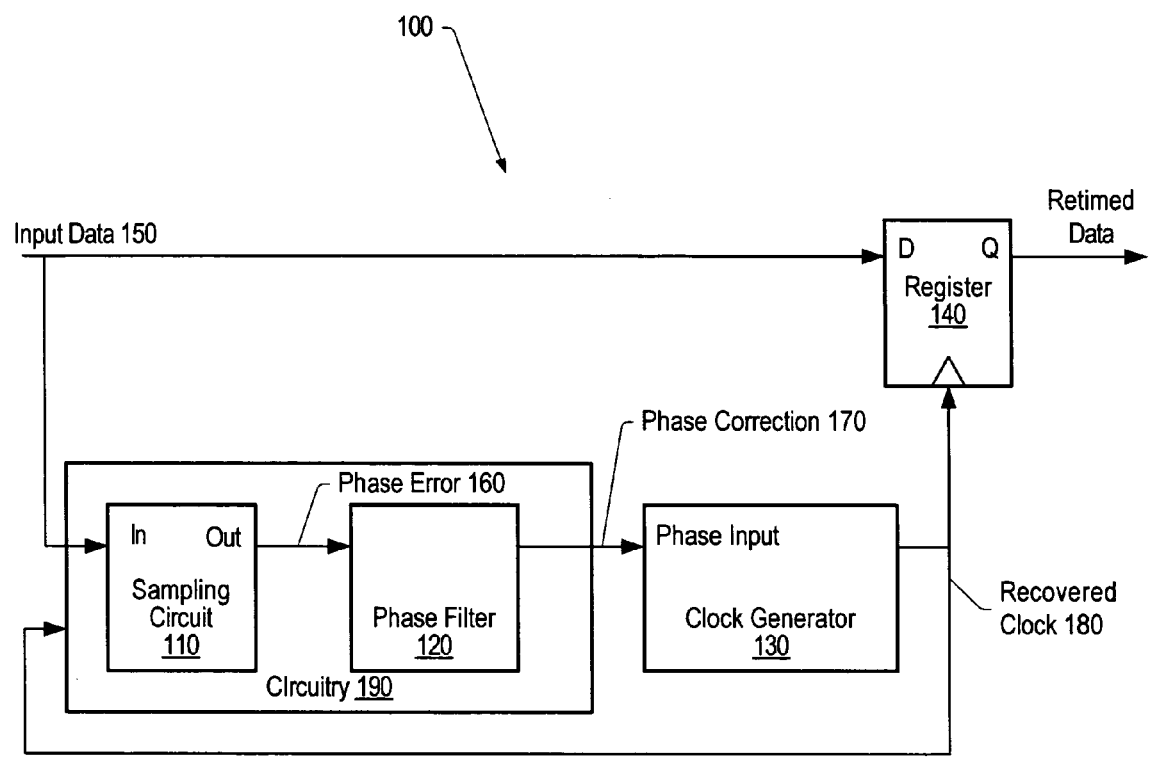
FIG. 1 is a generalized block diagram of one embodiment of a data receiver used to recover the clock and the data from a serial communications link.

While the invention is susceptible to various modifications and alternative forms, specific embodiments are shown by way of example in the drawings and are herein described in detail. It should be understood, however, that drawings and detailed descriptions thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

FIG. 1 is a generalized block diagram of one embodiment of a data receiver 100 used to recover the clock and the data from a serial communications link. As shown, data receiver 100 includes a clock generator 130, a register 140, and circuitry 190. In one embodiment, circuitry 190 may include a sampling circuit 110 and a phase filter 120. In operation, input data 150 is received and sampled by sampling circuit 110 which may compare the timing of the input data's bit transitions to the transitions of a clock generated by clock generator 130. Sampling circuit 110 may produce a phase error 160 that is conveyed to phase filter 120. Phase filter 120 may filter phase error 160 and deliver a phase correction 170 to clock generator 130. Clock generator 130 may then adjust the phase of the clock (i.e., recovered clock 180) that it generates and delivers to register 140. Register 140 may use recovered clock 180 to sample the received data to produce a retimed digital data output. In one embodiment, register 140 may be configured to sample the received data at a phase offset with respect to a cycle of recovered clock 180.

Various embodiments of sampling circuit 110 are possible. For example, in one embodiment, sampling circuit 110 may be a "bang-bang" sampler that takes a series of consecutive samples of the received data to determine if the data is early or late compared to recovered clock 180. The bang-bang sampler produces a "zero" value phase error 160 if two consecutive samples have the same bit value, a positive phase error 160 if the sample is taken too early compared to recovered clock 180, and a negative phase error 160 if the sample is taken too late compared to recovered clock 180. Alternatively, sampling circuit 110 may be any suitable circuit capable of detecting the phase of the received data compared to a reference clock signal as well as detecting the presence or absence of bit transitions in the received data.

Phase filter 120 may filter phase error 160 and deliver phase correction 170 to clock generator 130 to adjust the clock phase. The format of phase correction 170 output by phase filter 120 may depend on the specific implementation of clock generator 130. Details of the operation of phase filter 120 are given below. Various embodiments of clock generator 130 are possible. In one embodiment, clock generator 130 may be a voltage controlled oscillator that accepts an analog voltage from phase filter 120. Alternatively, clock generator 130 may comprise a circuit that accepts digital inputs from phase filter 120 according to which the phase of each clock cycle may remain unchanged, be increased, or be decreased. For example, in one embodiment, phase correction 170 may comprise two signals—a sign bit and a binary signal, both of which are sampled once for each cycle of recovered clock 180. If a sample of phase correction 170 is equal to "+1", clock generator 130 may decrease the phase of recovered clock 180 by a selected step size (e.g., one sixty-fourth of the clock period, or some other suitable step size). If a sample of phase correction 170 is equal to "−1", clock generator 130 may increase the phase of recovered clock 180 by a selected step size. Various step sizes may be configured, depending on the desired sensitivity of phase corrections and other feedback loop design considerations.

Figure 2:
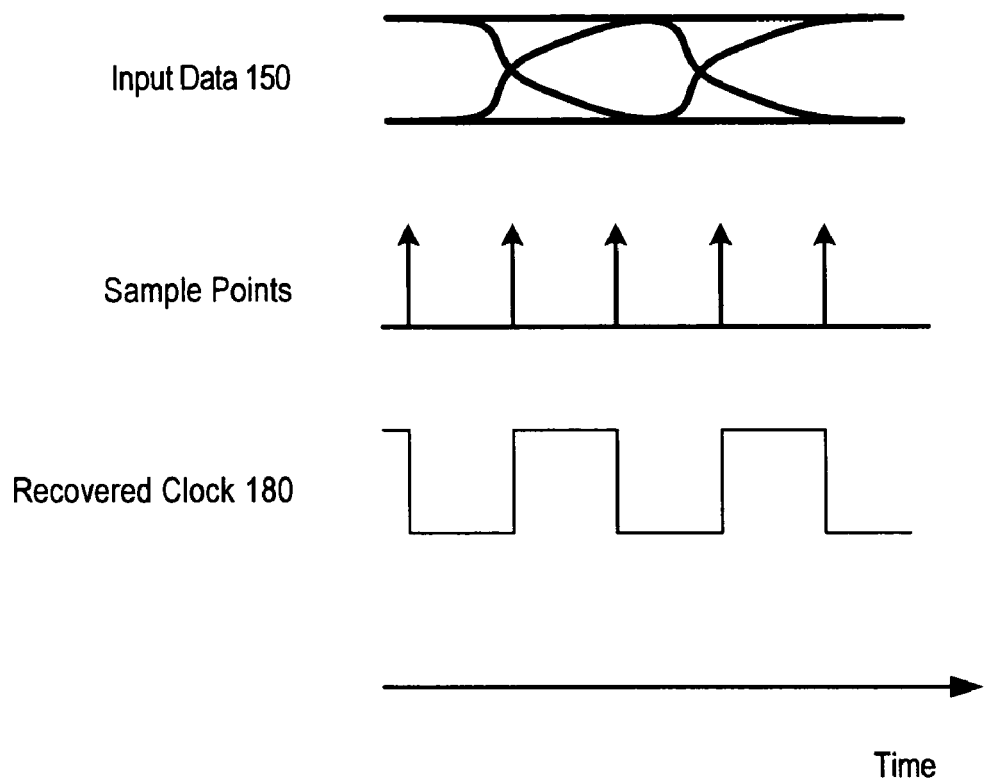
FIG. 2 illustrates the timing of one embodiment of sample points for sampling input data compared to the timing of a recovered clock.

FIG. 2 illustrates the timing of one embodiment of sample points for sampling input data 150 compared to the timing of recovered clock 180. In the embodiment shown, input data 150 forms an eye-diagram pattern characteristic of binary data. As shown, the sample points are aligned in phase with the transitions of the eye diagram and the mid-point of the eye opening. Accordingly, the illustrated signals are indicative of a recovered clock 180 that is in phase alignment with the input data 150.

In one embodiment, input data 150 is clocked at a nominally constant frequency with small changes in the phase of the embedded clock caused by jitter. In an alternative embodiment, the frequency of the embedded clock may be variable. For example, input data 150 may be clocked by a spread spectrum clock, i.e. a clock whose frequency is varied according to a pre-determined pattern. If input data 150 is clocked by a spread spectrum clock, then data receiver 100 may track frequency changes as well as correct for phase jitter. Embodiments of phase filter 120, such as the one described below, are capable of tracking frequency changes and phase jitter simultaneously.

Figure 3:
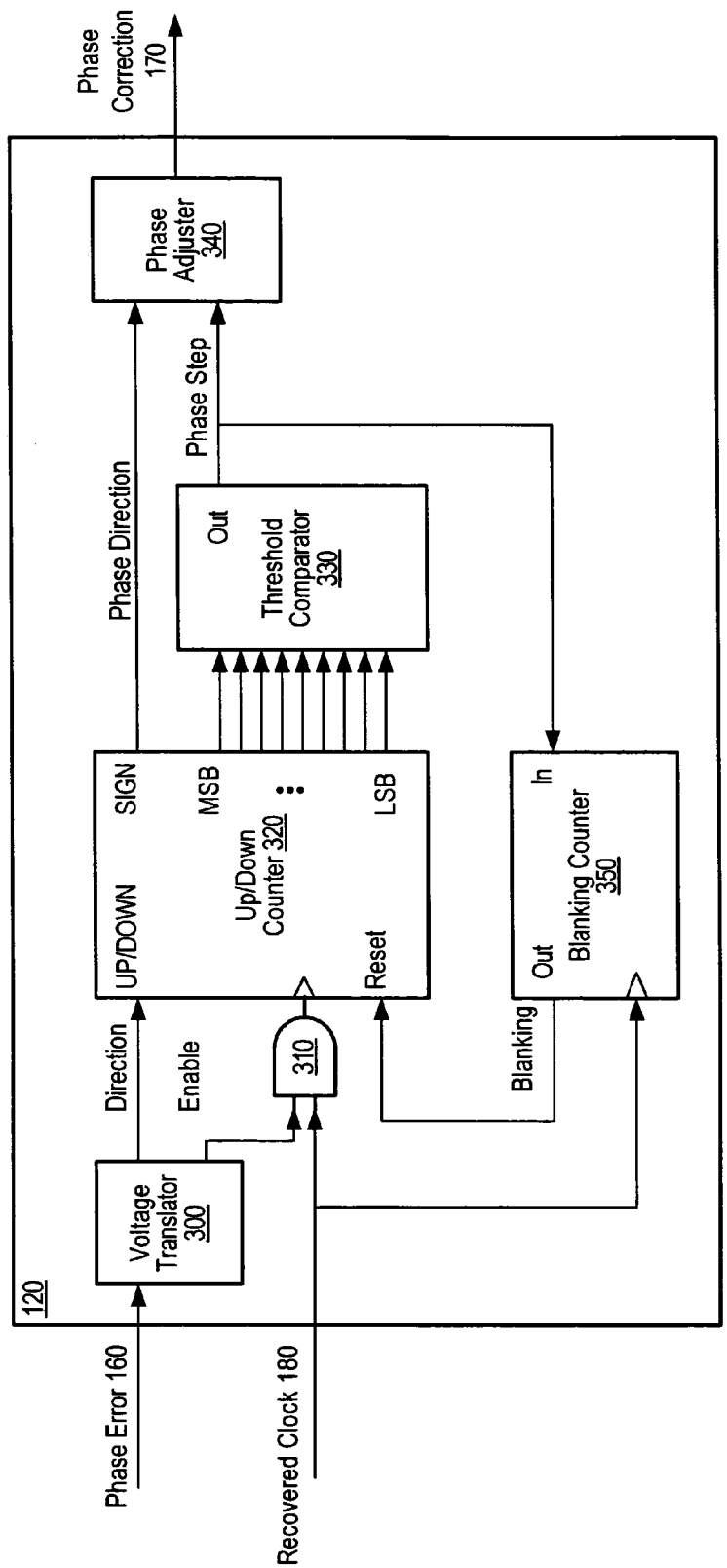
FIG. 3 is a block diagram of one embodiment of a phase filter.

FIG. 3 is a block diagram of one embodiment of phase filter 120. In the embodiment shown, phase filter 120 includes a voltage translator 300, a logic "AND" gate 310, an up/down counter 320, a threshold comparator 330, a phase adjuster 340, and a blanking counter 350. In operation, phase filter 120 may receive phase error 160 from sampling circuit 110 and may be clocked by recovered clock 180. After processing phase error 160, phase filter 120 may transmit phase correction 170 to clock generator 130.

More specifically, phase error 160 may be received by voltage translator 300 within phase filter 120. Voltage translator 300, in one embodiment, may convert the voltage signal of phase error 160 into a digital "direction" signal and a digital "enable" signal. If the phase error is a positive voltage, then the direction signal may be set to logic "1" and the enable signal may be set to logic "1". If the phase error is a negative voltage, then the direction signal may be set to logic "0" and the enable signal may be set to logic "1". If the phase error is a zero voltage, then the direction signal may remain unchanged from its previous value and the enable signal may be set to logic "0". The direction signal may be transmitted to the up/down input of up/down counter 320. The enable signal may be used to gate recovered clock 180 via logic "AND" gate 310. The output of gate 310 may be applied to the clock input of up/down counter 320.

Up/down counter 320, in one embodiment, may be reset to zero during initialization of data receiver 100. After initialization, up/down counter 320 may be responsive to clock input from gate 310 and direction input from voltage translator 300. In one embodiment, up/down counter 320 may produce a signed binary count. As illustrated the sign output may be transmitted to phase adjuster 340 indicating the direction in which the phase of recovered clock 180 should be adjusted. The magnitude of the output of up/down counter 320 may be compared to a threshold, which may be programmable, by threshold comparator 330. If the magnitude of the output of up/down counter 320 meets or exceeds the threshold, then threshold comparator 330 may transmit a phase step signal to phase adjuster 340. For example, in one embodiment, the threshold of threshold comparator 330 may be set to a count of sixteen. Phase adjuster 340, in response to receiving a phase direction and a phase step signal, may transmit a corresponding phase correction 170 to clock generator 130.

In one embodiment, in order to allow the phase of recovered clock 180 to settle after a phase correction, a phase step from threshold comparator 330 may also trigger blanking counter 350 to reset up/down counter 320. Up/down counter 320 may remain in a reset condition until blanking counter 350, clocked by recovered clock 180, counts to a configurable "blanking" interval. Upon reaching the configurable blanking interval, the reset input of up/down counter 320 may be cleared, enabling additional phase error inputs. Accordingly, the blanking counter 350 may cause phase steps to be separated by a time interval that is determined by a given blanking interval and the period of recovered clock 180. For example, in one embodiment, the blanking interval may be configured to be twenty-four cycles of recovered clock 180.

Figure 4:
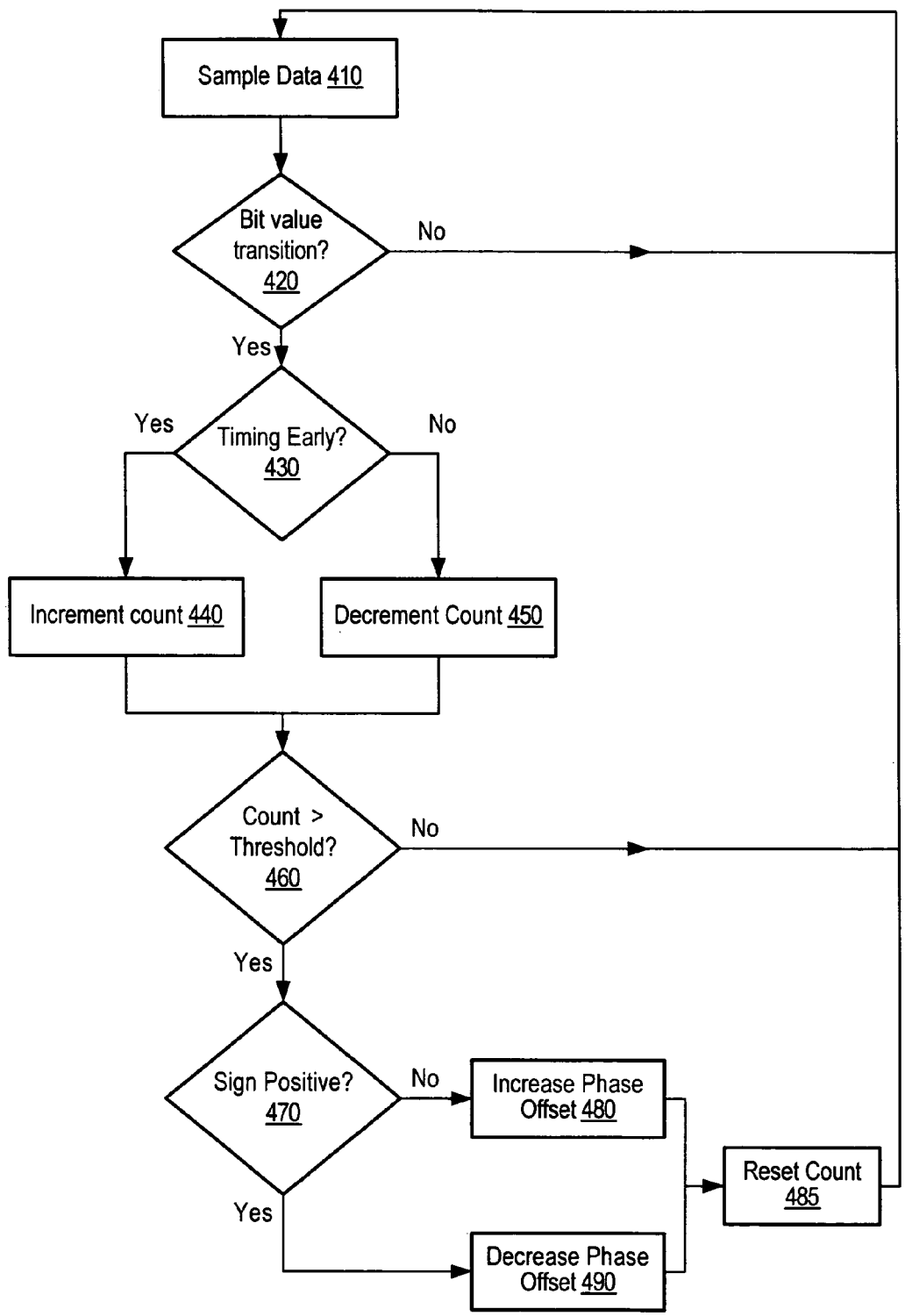
FIG. 4 illustrates one embodiment of a process that may be executed by a data receiver to filter a phase error and produce a phase correction using an up/down counter.

FIG. 4 illustrates one embodiment of a process 400 that may be executed by data receiver 100 to filter phase error 160 and produce phase correction 170 using up/down counter 320. Data receiver 100 may begin by taking a series of consecutive samples of input data 150 (block 410) to determine whether or not there is a transition in the bit value between two consecutive bits (decision block 420). If there is not a bit value transition, then data receiver 100 may return to block 410. If there is a bit value transition, data receiver 100 may compare the timing of the bit transition to that of recovered clock 180 (block 430). If the timing of the bit transition is early, then data receiver 100 may increment an up/down counter 320 (block 440). If the timing of the bit transition is late, then data receiver 100 may decrement the up/down counter 320 (block 450).

Each time data receiver 100 changes the count of up/down counter 320, it may test the count value against a threshold value (decision block 460). If the count value does not exceed the threshold, data receiver 100 may return to block 410. If the count value meets or exceeds the threshold, data receiver 100 may evaluate a sign bit from up/down counter 320 (decision block 470). If the sign bit is negative, data receiver 100 may transmit a phase correction signal to clock generator 130 to increase the phase offset of recovered clock 180 (block 480) and reset the count (block 485). If the sign bit is positive, data receiver 100 may transmit a phase correction signal to clock generator 130 to decrease the phase offset of recovered clock 180 (block 490) and reset the count (block 485). After transmitting either an increasing or a decreasing phase correction signal and resetting the count, data receiver 100 may return to block 410 to examine the next two consecutive bits. It is noted that alternative embodiments may adjust the phase offset in the opposite direction than that described above, and the condition indicated by block 460 may be chosen such that an adjustment is made if the threshold is either equaled or exceeded. All such alternatives are contemplated. In addition, the threshold value may be configurable.

Figure 5:
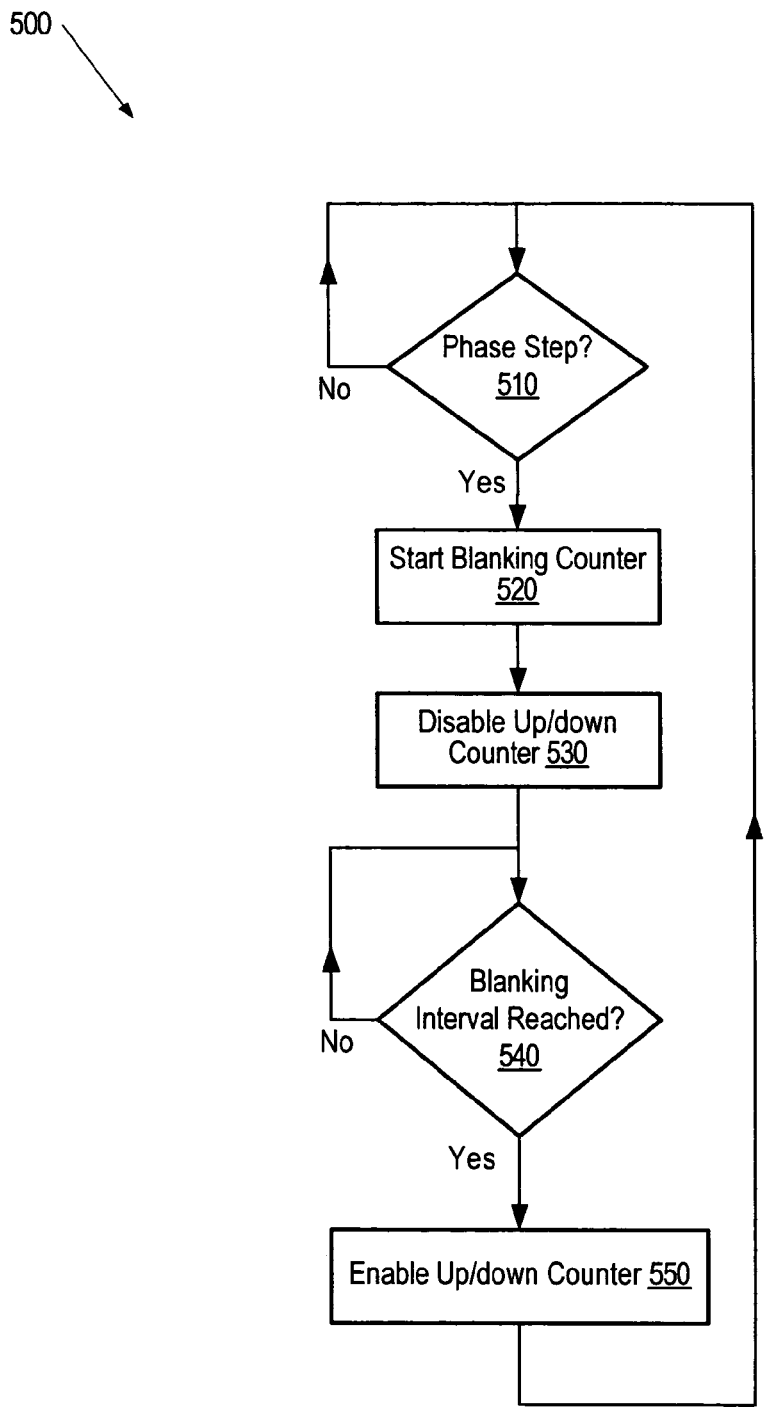
FIG. 5 illustrates one embodiment of a process that may be executed by a data receiver to disable phase steps from a phase filter for a configurable period of time after a phase correction has been made.

FIG. 5 illustrates one embodiment of a process 500 that may be executed by data receiver 100 to disable phase steps from phase filter 120 for a configurable period of time after a phase correction has been made. Data receiver 100 may begin by monitoring phase filter 120 to detect a phase step signal (decision loop 510). If a phase step is detected, data receiver 100 may start blanking counter 350 (block 520) and disable up/down counter 320 (block 530). Data receiver 100 may then monitor blanking counter 350 until the configured blanking interval is reached (decision loop 540). For example, in one embodiment, the blanking interval is determined by blanking counter 350 counting cycles of recovered clock 180. Once the blanking interval is reached, data receiver 100 may reset blanking counter 350, re-enable up/down counter 320 (block 550), and return to monitoring phase filter 120 for phase step signals.

Figure 6:
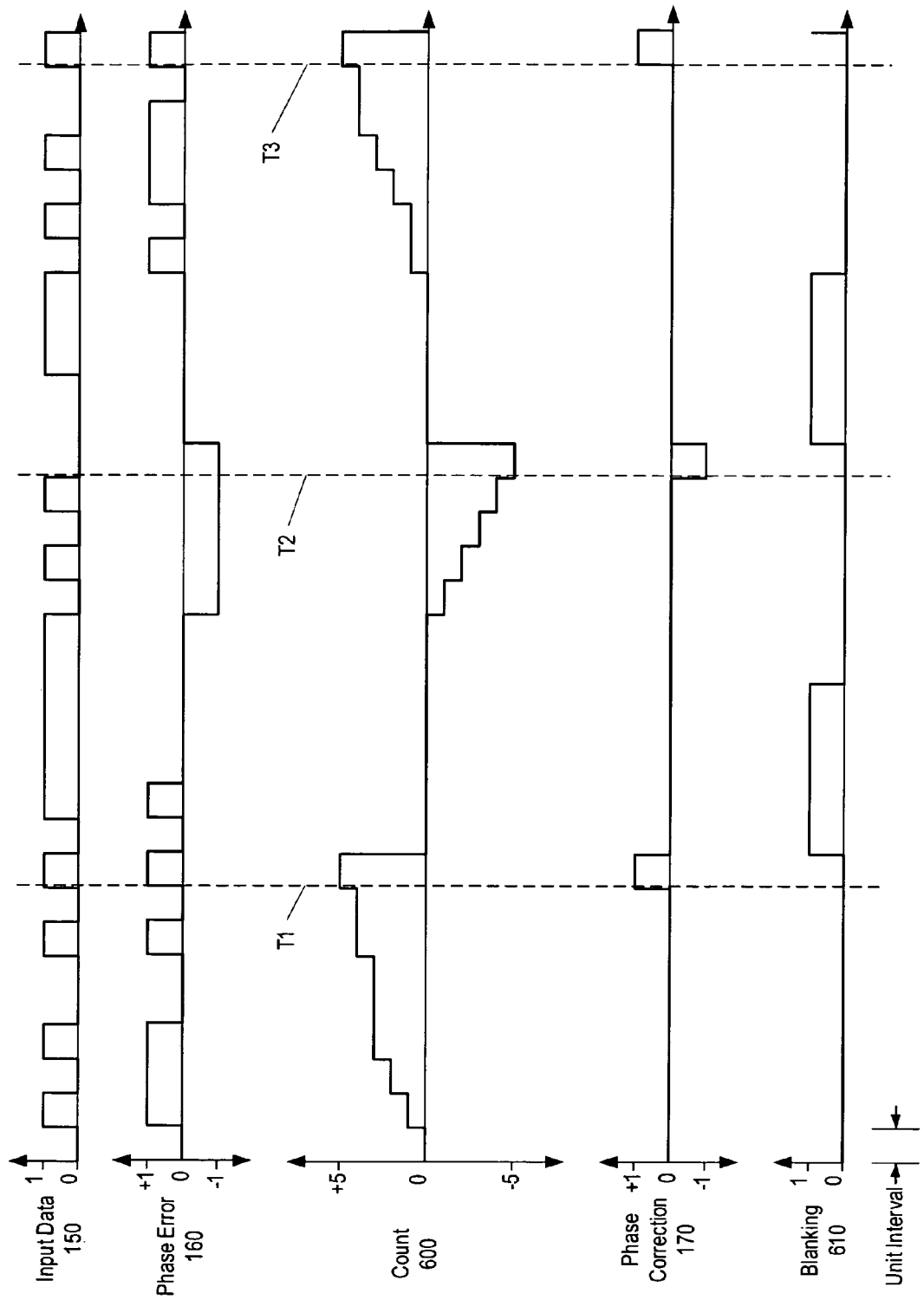
FIG. 6 illustrates one embodiment of the timing of signals used by a data receiver to adjust the phase of a recovered clock.

FIG. 6 illustrates one embodiment of the timing of signals used by data receiver 100 to adjust the phase of recovered clock 180. The signals shown in the illustration include input data 150, phase error 160, the output count 600 from up/down counter 320, phase correction 170, and a blanking signal 610. The horizontal axis represents time measured in "unit intervals", where a unit interval may correspond to one complete cycle of recovered clock 180. In the illustrated embodiment, input data 150 comprises a random sequence of bits. It is noted that input data 150 may include periods during which the bit value does not change for two or more consecutive unit intervals. Phase error 160 is also shown in FIG. 6. It is further noted that the value of phase error 160 may be "0" during a clock cycle following a period in which the bit value of input data 150 does not change. The value of phase error 160 may be +1 if a bit value transition occurs early with respect to a transition of recovered clock 180. The value of phase error 160 may be −1 if a bit value transition occurs late with respect to a transition of recovered clock 180.

As shown, a "+1" value of phase error 160 may be followed by a corresponding increase in the output count of up/down counter 320. A "−1" value of phase error 160 may be followed by a corresponding decrease in the output count of up/down counter 320. Data receiver 100 may be configured to include a desired count threshold value. For example, in the illustrated embodiment, a count threshold value is set to ±5. Accordingly, when the output count of up/down counter 320 reaches +5, a phase correction of +1 may be transmitted to clock generator 130. Similarly, when the output count of up/down counter 320 reaches −5, a phase correction of −1 may be transmitted to clock generator 130. Following the transmission of a phase correction of either +1 or −1, data receiver 100 may transmit a blanking signal to up/down counter 320 for a configurable interval of time. For example, in the illustrated embodiment, a blanking signal is transmitted for 5 unit intervals. It is noted that although phase error 160 may have a non-zero value during a blanking interval, the output count of up/down counter 320 may remain unchanged during this period.

In the particular example illustrated in FIG. 6, phase errors 160 are detected in input data 150, resulting in an increasing count from up/down counter 320 that reaches the count threshold of +5 at time T1. Data receiver 100 responds to the count threshold by issuing a phase correction 170 of +1. On the next cycle of recovered clock 180, the blanking signal is set for 5 cycles of recovered clock 180, disabling up/down counter 320. After the blanking interval, phase errors 160 are detected in input data 150, resulting in a decreasing count from up/down counter 320 that reaches the count threshold of −5 at time T2. Data receiver 100 responds to the count threshold by issuing a phase correction 170 of −1. On the next cycle of recovered clock 180, the blanking signal is set for 5 cycles of recovered clock 180, disabling up/down counter 320. After the blanking interval, phase errors 160 are detected in input data 150, resulting in an increasing count from up/down counter 320 that reaches the count threshold of +5 at time T3. Once again, data receiver 100 responds to the count threshold by issuing a phase correction 170 of +1, and so on.

Various alternative settings of the count threshold and the blanking interval are possible. For example, in one embodiment, a higher or lower count threshold may be configured to reduce or increase, respectively, the sensitivity of recovered clock 180 to short-term fluctuations in the phase of the clock encoded in input data 150. In addition higher or lower values of the blanking interval may be configured, depending on the time desired to allow clock generator 130 to settle after a phase correction is made.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data receiver comprising:
    a clock generator configured to output a reference clock; and
    circuitry configured to:
        measure a direction of a phase difference between an input data stream and the reference clock;
        increment a counter if the phase difference is in a first direction;
        decrement the counter if the phase difference is in a direction opposite to the first direction;
        convey a phase correction signal to the clock generator if a value of the counter meets or exceeds a threshold; and
        disable the counter for a pre-determined number of cycles of the reference clock in response to a change in the phase correction signal;
    wherein the clock generator is configured to adjust the phase of the reference clock in response to receiving the phase correction signal.

2. The data receiver of claim 1, further comprising a programmable first storage device configured to hold a threshold value, wherein the counter is configured to store a signed count, and wherein the circuitry is configured to:
    convey the phase correction signal to the clock generator with a first polarity if the signed count is positive and the magnitude of the signed count meets or exceeds the threshold value; and
    convey the phase correction signal to the clock generator with a polarity opposite to the first polarity if the signed count is negative and the magnitude of the signed count meets or exceeds the threshold value.

3. The data receiver of claim 1, further comprising a register configured to sample the input data once per cycle of the reference clock at a predetermined phase offset with respect to each reference clock cycle.

4. The data receiver of claim 1, wherein the input data stream comprises data clocked by a spread spectrum clock.

5. The data receiver of claim 2,
wherein the circuitry is configured to measure the direction of the phase difference between the input data stream and the reference clock by sampling the input data stream; and
wherein the phase correction signal causes the clock generator to:
advance the phase of the reference clock if the input data stream is early compared to the reference clock; and
delay the phase of the reference clock if the input data stream is late compared to the reference clock.

6. The data receiver of claim 1, wherein the number of cycles of the reference clock corresponds to a configurable value stored in a programmable second storage device within the circuitry.

7. The data receiver of claim 1, wherein the data receiver is fabricated into a serial communications integrated circuit.

8. A method of recovering a clock and data from an input data stream, the method comprising:
a clock generator generating a reference clock;
measuring a direction of a phase difference between the input data stream and the reference clock;
generating a phase error signal indicative of the direction of the phase difference between the input data stream and the reference clock;
incrementing a counter if the phase error signal indicates a phase difference in a first direction;
decrementing the counter if the phase error signal indicates a phase difference in a direction opposite to the first direction;
conveying a phase correction signal to the clock generator if a value of the counter meets or exceeds a threshold;
the clock generator adjusting the phase of the reference clock in response to receiving the phase correction signal; and
disabling the counter for a pre-determined number of cycles of the reference clock in response to a change in the phase correction signal.

9. The method of claim 8, further comprising sampling the input data at a pre-determined phase offset within a cycle of the reference clock.

10. The method of claim 8, wherein the input data stream comprises data clocked by a spread spectrum clock.

11. The method of claim 8, wherein the counter produces a signed count, the method further comprising:
storing a threshold value in a programmable first storage device;
conveying a phase correction signal to the clock generator with a first polarity if the signed count is positive and magnitude of the signed count meets or exceeds the threshold value; and
conveying a phase correction signal to the clock generator with a polarity opposite to the first polarity if the signed count is negative and the magnitude of the signed count meets or exceeds the threshold value.

12. The method of claim 8, wherein the pre-determined number of cycles of the reference clock corresponds to a configurable value stored in a programmable second storage device.

13. A system comprising:
a transmitter configured to transmit source-synchronous data;
a receiver configured to receive the source-synchronous data, the receiver comprising:
a clock generator configured to output a reference clock;
circuitry configured to:
measure a direction of a phase difference between an input data stream and the reference clock;
increment a counter if the phase difference is in a first direction;
decrement the counter if the phase difference is in a direction opposite to the first direction;
convey a phase correction signal to the clock generator if a value of the counter meets or exceeds either a threshold; and
disable the counter for a pre-determined number of cycles of the reference clock in response to a change in the phase correction signal;
wherein the clock generator is configured to adjust the phase of the reference clock in response to receiving the phase correction signal.

14. The system of claim 13, further comprising a programmable first storage device configured to hold a threshold value, wherein the counter is configured to produce a signed count, and wherein the circuitry is configured to:
convey the phase correction signal to the clock generator with a first polarity if the signed count is positive and the magnitude of the signed count meets or exceeds the threshold value; and
convey the phase correction signal to the clock generator with a polarity opposite to the first polarity if the signed count is negative and the magnitude of the signed count meets or exceeds the threshold value.

15. The system of claim 13, further comprising a register configured to sample the input data once per cycle of the reference clock at a pre-determined phase offset with respect to each reference clock cycle.

16. The system of claim 13, wherein the input data stream comprises data clocked by a spread spectrum clock.

17. The system of claim 14,
wherein the circuitry is configured to measure the direction of the phase difference between the input data stream and the reference clock by sampling the input data stream; and
wherein the phase correction signal causes the clock generator to:
advance the phase of the reference clock if the input data stream is early compared to the reference clock; and
delay the phase of the reference clock if the input data stream is late compared to the reference clock.

18. The system of claim 13, wherein the number of cycles of the reference clock corresponds to a configurable value stored in a programmable second storage device within the circuitry.

* * * * *